United States Patent
Tsuchiko (10) Patent No.: US 10,157,984 B2
(45) Date of Patent: Dec. 18, 2018

(54) SEMICONDUCTOR DEVICE INTEGRATING HIGH AND LOW VOLTAGE DEVICES

(71) Applicant: Alpha & Omega Semiconductor Incorporated, Sunnyvale, CA (US)

(72) Inventor: Hideaki Tsuchiko, San Jose, CA (US)

(73) Assignee: Alpha & Omega Semiconductor Incorporated, Sunnyvale, CA (US)

( * ) Notice: Subject to any disclaimer, the term of this patent is extended or adjusted under 35 U.S.C. 154(b) by 0 days.

(21) Appl. No.: 14/968,679

(22) Filed: Dec. 14, 2015

(65) Prior Publication Data
US 2016/0099310 A1    Apr. 7, 2016

Related U.S. Application Data

(63) Continuation of application No. 13/237,842, filed on Sep. 20, 2011, now Pat. No. 9,214,457.

(51) Int. Cl.
*H01L 29/06* (2006.01)
*H01L 21/8222* (2006.01)
(Continued)

(52) U.S. Cl.
CPC ........ *H01L 29/0649* (2013.01); *H01L 21/761* (2013.01); *H01L 21/8222* (2013.01); *H01L 21/8228* (2013.01); *H01L 21/823481* (2013.01); *H01L 21/823493* (2013.01); *H01L 27/0623* (2013.01); *H01L 27/0629* (2013.01); *H01L 27/0635* (2013.01); *H01L 27/088* (2013.01); *H01L 27/0821* (2013.01); *H01L 27/0823* (2013.01); *H01L 29/063* (2013.01);
(Continued)

(58) Field of Classification Search
CPC ............... H01L 21/761; H01L 21/8222; H01L 21/8228; H01L 21/823481; H01L 21/823493; H01L 27/0623; H01L 27/0629; H01L 27/0821; H01L 27/0823; H01L 27/088; H01L 29/063; H01L 29/0635; H01L 29/0649; H01L 29/10; H01L 29/1079; H01L 29/1083; H01L 29/66272; H01L 29/732; H01L 29/735; H01L 29/7816; H01L 29/7835; H01L 29/8611
USPC ......... 257/335–343, 409, 487–496; 438/217, 438/289, 294, 307, 510–569
See application file for complete search history.

(56) References Cited

U.S. PATENT DOCUMENTS

4,665,424 A * 5/1987 Hirao ................ H01L 29/42304
257/518
4,831,430 A * 5/1989 Umeji ................ H01L 27/1443
257/463
(Continued)

*Primary Examiner* — Allan R Wilson
(74) *Attorney, Agent, or Firm* — JDI Patent; Joshua Isenberg; Robert Pullman (57) ABSTRACT

The present invention is directed to a method for forming multiple active components, such as bipolar transistors, MOSFETs, diodes, etc., on a semiconductor substrate so that active components with higher operation voltage may be formed on a common substrate with a lower operation voltage device and incorporating the existing proven process flow of making the lower operation voltage active components. The present invention is further directed to a method for forming a device of increasing operation voltage over an existing device of same functionality by adding a few steps in the early manufacturing process of the existing device therefore without drastically affecting the device performance.

10 Claims, 13 Drawing Sheets

VHV NLDMOS (51) Int. Cl.
  *H01L 21/8228* (2006.01)
  *H01L 21/8234* (2006.01)
  *H01L 21/761* (2006.01)
  *H01L 27/06* (2006.01)
  *H01L 27/082* (2006.01)
  *H01L 27/088* (2006.01)
  *H01L 29/66* (2006.01)
  *H01L 29/732* (2006.01)
  *H01L 29/78* (2006.01)
  *H01L 29/10* (2006.01)
  *H01L 29/735* (2006.01)
  *H01L 29/861* (2006.01)
  *H01L 29/423* (2006.01)

(52) U.S. Cl.
  CPC .......... *H01L 29/10* (2013.01); *H01L 29/1079* (2013.01); *H01L 29/1083* (2013.01); *H01L 29/66272* (2013.01); *H01L 29/732* (2013.01); *H01L 29/735* (2013.01); *H01L 29/7816* (2013.01); *H01L 29/7835* (2013.01); *H01L 29/8611* (2013.01); *H01L 29/42368* (2013.01)

(56) References Cited

U.S. PATENT DOCUMENTS

| | | | | |
|---|---|---|---|---|
| 4,890,146 | A * | 12/1989 | Williams | H01L 27/0727 257/336 |
| 4,969,030 | A * | 11/1990 | Musumeci | H01L 21/761 257/337 |
| 5,153,697 | A * | 10/1992 | Mosher | H01L 21/74 257/206 |
| 5,330,922 | A * | 7/1994 | Erdeljac | H01L 21/8249 148/DIG. 13 |
| 6,150,200 | A * | 11/2000 | Merchant | H01L 29/7816 257/E29.039 |
| 6,252,279 | B1 * | 6/2001 | Kim | H01L 29/7816 257/335 |
| 6,365,447 | B1 * | 4/2002 | Hebert | H01L 21/8249 257/E21.696 |
| 2005/0042815 | A1 * | 2/2005 | Williams | H01L 21/26513 438/202 |
| 2008/0093641 | A1 * | 4/2008 | Ludikhuize | H01L 29/0634 257/289 |

\* cited by examiner

FIG. 11 – HV VNPN

FIG. 12 – HV LPNP

FIG. 13 – HV PN Diode

FIG. 14 – HV NLDMOS

FIG. 15 – HV PLDMOS

FIG. 16 – VHV NLDMOS

SEMICONDUCTOR DEVICE INTEGRATING HIGH AND LOW VOLTAGE DEVICES

CROSS-REFERENCE TO RELATED APPLICATIONS

The instant application is a continuation application of U.S. patent application Ser. No. 13/237,842 filed Sep. 20, 2011 entitled METHOD OF INTEGRATING HIGH VOLTAGE DEVICES now U.S. Pat. No. 9,214,457 and listing Hideaki Tsuchiko as the sole inventor, which is incorporated by reference herein.

BACKGROUND OF THE INVENTION

The invention relates to high voltage semiconductor devices and the manufacturing process thereof and in particular, to modular techniques for adding high voltage devices to an existing process flow for semiconductor devices.

Devices having higher voltage rating than existing devices are often required to be integrated on a chip of existing device to satisfy the demand of new applications. In many cases such integration of higher voltage device into existing lower voltage device requires drastic change to the proven process flow and/or conditions for manufacturing the existing lower voltage device resulting in performance deterioration of the existing lower voltage device to a degree that device models will have to be updated. To avoid the long design cycle and high cost of product development, efforts have been focused on techniques that require only minor change to the existing low voltage device process conditions thus minimize the impact to the performance of existing lower voltage device.

Figure 1:
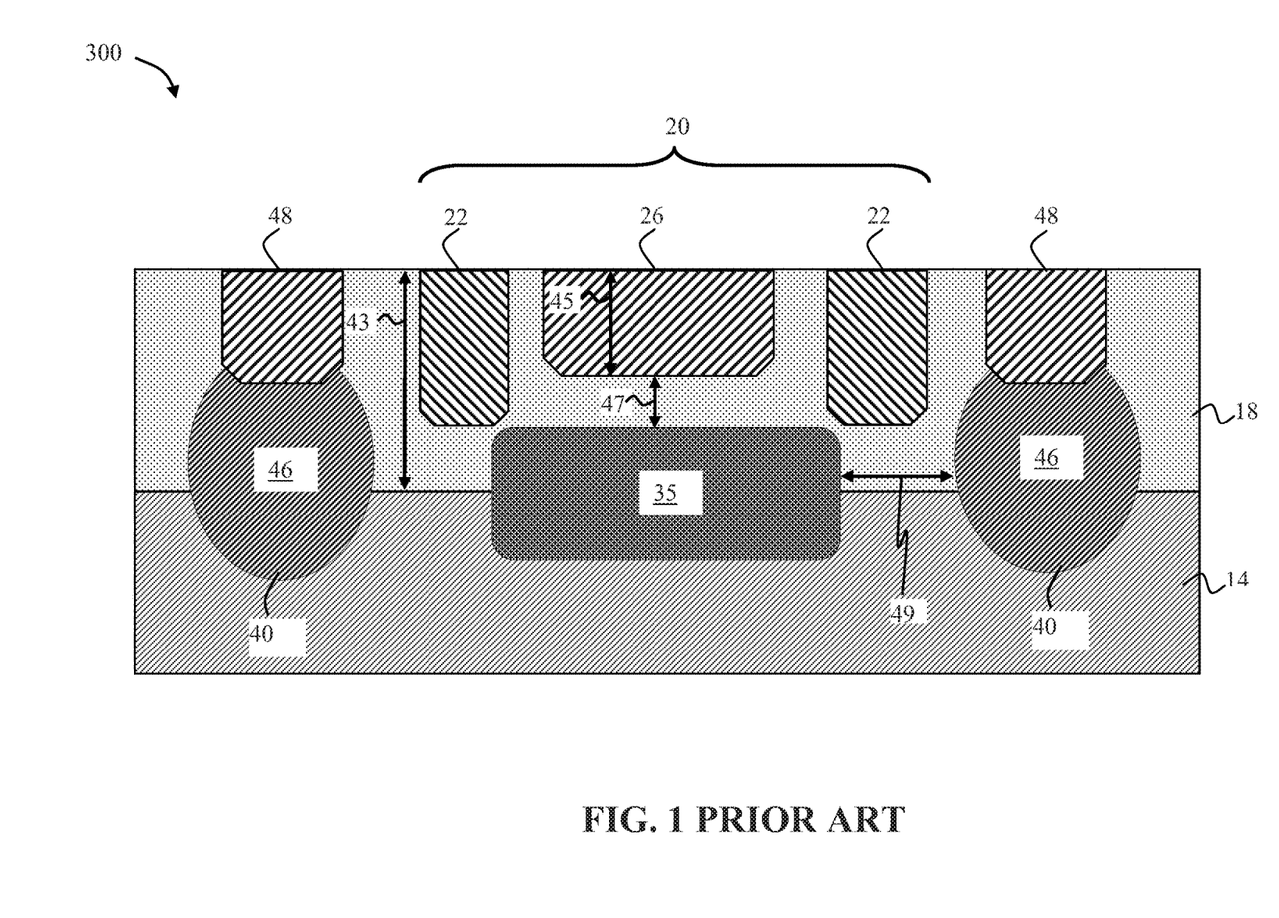
FIG. 1 is a cross-sectional view of an existing device fabricated on a substrate in accordance with the prior art.

Generally in BCD or BiCMOS technologies, the highest operating voltage is controlled by reach-through breakdown of a vertical structure of P to N junction. This vertical junction breakdown is a function of Epi thickness and doping density. FIG. 1 shows an example of an existing device 300 formed in a semiconductor chip comprising an n-epitaxial layer 18 having a thickness 43 disposed on a P substrate 14 having a resistivity of 11 to 15 Ohms-cm. Without showing the detail structure of the device 300, a number of N-wells 22, 24 and P-wells 26, 48 are provided in the N-Epi layer. Buried P regions 46 extend from the bottoms of edge P-well 48 into the substrate layer 14 providing isolation of the device 300 from the rest area of the semiconductor chip where other devices may be formed. Device 300 further comprises a N buried region 35 under the P-well 26 to limit the maximum operation voltage of the device 300. Using a 5 um Epi layer 18 and controlling the depth 45 of P-well 26 to optimize the performance of device 300, the vertical space 47 between the bottom of P-well 26 and the top of buried N region 35 limits a vertical breakdown voltage at around 70V therefore limit the device 300 operates under 70V when a lateral breakdown controlling factor 49, namely the lateral distance between the buried P regions 46 and the N buried region 35, is large enough that a lateral breakdown voltage is much higher than the vertical breakdown voltage. The manufacturing process would start with the substrate layer 14 then implant ions for regions 35 and 46 to be formed respectively in later steps. The epitaxial layer 18 is then disposed on top of the substrate layer 14 and multiple N-wells and P-wells are formed extending downwards from a top surface of the epitaxial layer. Additional steps may be carried out to form a specific function such as a bipolar transistor or a MOSFET. In the case a higher operation voltage device is required to be integrated in a separate area on the same chip, one method to increase P to N vertical breakdown voltage is to increase the thickness of Epi layer 18. This will affect the performance and isolation of existing device 300 if the process and condition of making device 300 remain the same.

Another method is introducing a lighter doping layer to reduce the dopant concentration. For example, in United States patent publication number US2004/0113204 Hideaki Tsuchiko discloses an integrated circuit that includes a high voltage Schottky barrier diode and a low voltage device. The Schottky barrier diode includes a lightly doped p-well as a guard ring while the low voltage devices are built using standard, more highly doped p-wells. By using a process including lightly doped p-wells and standard p-wells, high voltage and low voltage devices can be integrated onto the same integrated circuit. Although the Schottky barrier diode built in the lightly doped P-well increases its breakdown voltage to 120V from 80V when built in a standard doped P-well, the example showing in FIG. 1 can only increase breakdown voltage about 0-20V.

Combination of both methods and device layout enable integrating high and low voltage devices on the same chip. However, these methods often have a minor affect to existing device performances. Some devices require a minor tweak to SPICE models. Therefore it is highly desirable to develop new techniques to integrate a high voltage device into a low voltage chip that require only inserting a few steps to existing low voltage process flow to add higher voltage devices onto the low voltage device chip yet without impacting the performance of the low voltage device.

SUMMARY OF THE INVENTION

The present invention is directed, to a method for forming multiple active components, such as bipolar transistors, MOSFETs, diodes, etc., on a semiconductor substrate so that active components with higher operation voltage may be formed on a common substrate with a lower operation voltage device and incorporating the existing proven process flow of making the lower operation voltage active components. To that end, the method includes depositing upon the substrate, of a first conductivity type, a first epitaxial layer of the first conductivity type and a second epitaxial layer of a second conductivity type opposite to the first conductivity type on top of the first epitaxial layer; generating, in one of the multiple layers, active regions of a multiple transistors; forming a plurality of spaced-apart buried regions having the second conductivity type, a first subset of the regions being formed proximate to the substrate, with a second subset of which has a bifurcated dopant concentration; and developing isolation regions between a pair of adjacent devices of the multiple devices so as to surround a buried region and active regions of one of the devices of the adjacent pair.

The present invention is further directed to a method for forming a device of increasing operation voltage over an existing device of same functionality by adding a few steps in the early manufacturing process of the existing device therefore without drastically affecting the device performance. Specifically the method including the steps of providing a substrate layer of a first conductivity type; growing a first epitaxial layer of the first conductivity type on top of the substrate; growing a second epitaxial layer of the second conductivity type on top of the second epitaxial layer; forming a deep buried doped region of the second conductivity including a lightly doped region extending to the second epitaxial layer and a highly doped region surrounded by the lightly doped region; and forming a first doped well of the first conductivity type extending downwards from a top surface of the second epitaxial layer above the deep buried highly doped region.

These and other embodiments are described in further detail below.

DETAILED DESCRIPTION OF THE INVENTION

Figure 2:
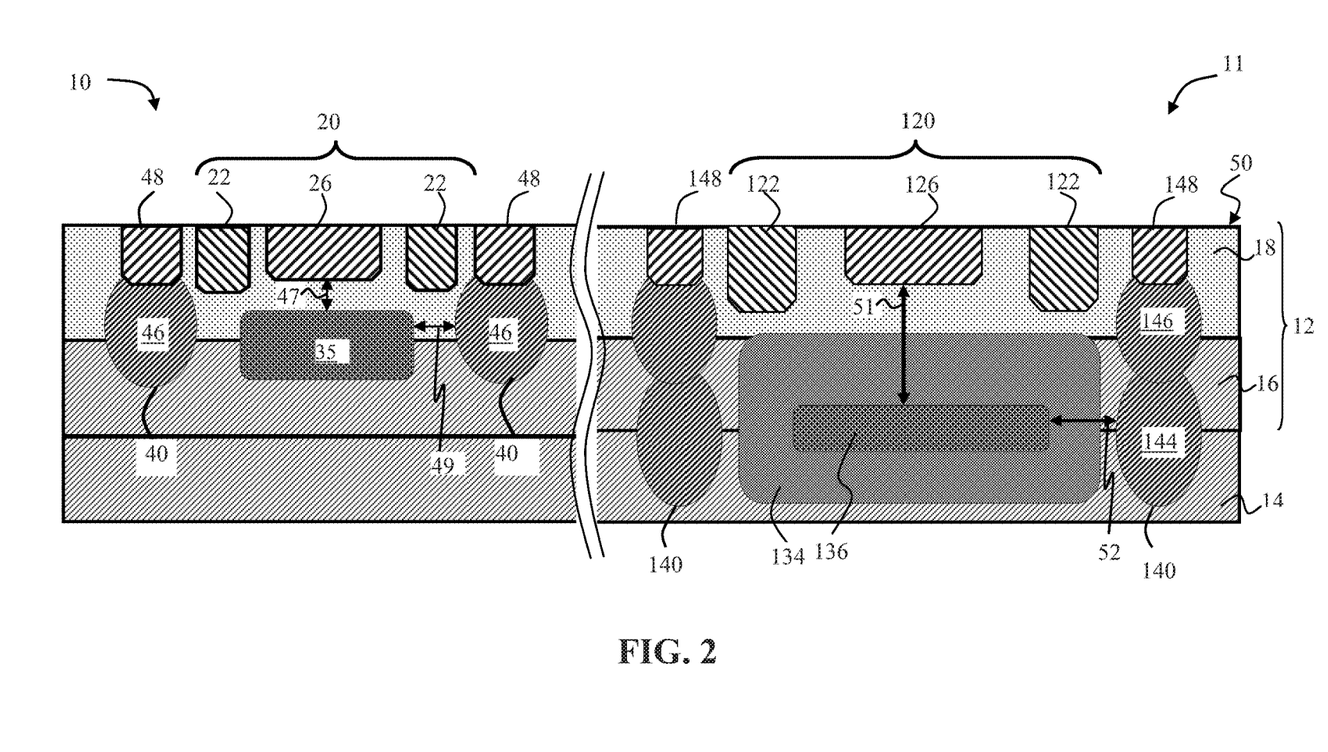
FIG. 2 is a cross-sectional view of a higher operation voltage device fabricated on a common substrate with a lower operation voltage device of FIG. 1 in accordance with one aspect of the present invention.

Referring to FIG. 2 in accordance with the present invention, first and second devices 10 and 11 of different operation voltage ratings are formed on a common semiconductor chip having a substrate layer 14 having a resistivity of 11 to 15 Ohms-cm, a first epitaxial layer 16 stacking on top of substrate layer 14 and a second epitaxial layer 18 stacking on top of the first epitaxial layer 16. The epitaxial layer 16 is doped to substantially the same concentration as the substrate layer 14 having a resistivity of 11 to 15 Ohms-cm. Substrate 14 and epitaxial layer 16 are preferably p-type. The second epitaxial layer 18 formed on epitaxial layer 16 is preferably n-type. Layers 16 and 18 define a layer stack 12.

Active region 20 of device 10 is formed in the n-type epitaxial layer 18. Without showing the detail structure of device 10, a number of N-wells 22, 24 and P-wells 26, 48 are provided in the N-Epi layer. A greater concentration of n-type dopants is present in wells 22 and 24 than is present in layer 18. P-type dopants of well 26 may be present in a greater concentration than are present in epitaxial layer 16 and/or substrate 14. A buried region of n-type dopants, referred to as a buried region 35, extends between p-epitaxial layer 16 and n-epitaxial layer 18 having a controlled vertical space 47 less than the thickness of epitaxial layer 18 between the bottom of P-well 26 and the top of buried N region 35. Preferably the buried N region 35 is limited to a vicinity around the interface between p-epitaxial layer 16 and n-epitaxial layer 18 such that a substantially greater concentration of n-type dopants is present in buried region 35 than is present in layer 18.

Disposed on opposing sides of active region 20 and buried region 35 are isolation regions 40 and 42. Isolation regions 40 and 42 are formed from a plurality of regions having p-type dopants concentrated therein in quantities greater than are present in either substrate 14 or epitaxial layer 16. Specifically, each of isolation regions 40 and 42 comprises of a high voltage P well (HVPW) 48 located at a top portion of the n-epitaxial layer 18 and overlaps a buried region of p-type dopants (PBL) 46 extending between n-epitaxial layer 18 to the p-epitaxial layer 16 without reaching P substrate layer 14. Device 10 is similar to the device 300 shown in FIG. 1, except that device 10 has an additional epitaxial layer 16 formed on top of the substrate. Since the epitaxial layer 16 has about the same P dopant concentration as the substrate layer 14, the performance of device 10 is identical to the device 300 as the epitaxial layer 16 can be considered as an extension of substrate layer 14. The existing manufacturing process and conditions of making device 300 can be transferred in whole as a process module of making device 10.

Also formed in substrate 14 and layer stack 12 is transistor 11 in accordance with the present invention. Transistor 11 includes, formed into layer 18, an active region 120. Without showing the detail structure of device 11, a number of N-wells 122, 124 and P-wells 126, 148 are provided in the N-Epi layer 18. A greater concentration of n-type dopants is present in wells 122 and 124 than is present in regions of layer 18 outside of wells 122 and 124. P-type dopants of well 126 may be present in a greater concentration than are present in layer 16 and/or substrate 14. A deep buried region of n-type dopants, referred to as a deep buried region 134, extends between substrate 14 and layer stack 12. Deep buried region 134 has a bifurcated dopant concentration, which includes a highly doped first n-type dopant portion, referred to as deep buried highly doped region 136 and a lightly doped second n-type dopant portion, referred to as deep buried lightly doped region 138 with second portion 138 surrounding the first portion 136. Preferably highly doped first n-type dopant portion 136 is limited to a vicinity around the interface between the substrate layer 14 and the p-epitaxial layer 16 such that a substantially greater concentration of n-type dopants is present in highly doped first n-type dopant portion 136 than is present in layer 18. The second n-type dopant portion extending upward reaches the second epitaxial layer 18 and preferably has a dopant concentration substantially the same as layer 18.

For a given temperature, the second n-type dopants in portion 138 diffuse at a faster rate than the first n-type dopants in portion 136. In the present example the dopants concentrated in region 136 are antimony and the dopants concentrated in region 138 are phosphorous.

Disposed on opposing sides of active region 120 and deep buried region 134 are isolation regions 140 and 142. Isolation regions 140 and 142 are formed from a plurality of regions having p-type dopants concentrated therein in quantities greater than are present in either substrate 14 or layer 16 of layer stack 12. Specifically, isolation regions 140 and 142 are each comprised of three overlapping wells 144, 146 and 148 of p-type dopant concentrations. A first well 144 extends between substrate 14 and first layer 16. A second well 146 overlaps with well 144 and extends between first layer 16 and second layer 18. A third well 148 overlaps with well 146 and extends from surface 50 of second layer 18 toward first layer 16. It should be understood that isolation regions 140 and 142 function to isolate active region 120 from adjacent device active regions, one of which is shown as active region 20 formed on substrate 14 and layer stack 12.

An advantage with device 11 is that the breakdown voltage of the same is independent of the thickness of layer 14. Rather, a vertical breakdown voltage is controlled by a vertical distance 51 between region 136 and region 126. A lateral breakdown voltage is controlled by the lateral distance 52 between region 36 and of isolation regions 140 and 142, i.e., the shortest distance between either one of isolation regions 140 and 142 and region 136. The lateral breakdown controlling factors 49 and 52 respectively controlling the lateral breakdown of the device 10 and 11 can be easily increased to increase the lateral breakdown voltages much higher than the vertical breakdown voltages therefore the device breakdown is limited by the vertical breakdown. For a thickness of P-epitaxial layer 16 of about 4 microns, the vertical breakdown voltage of the device 11 between the high voltage P well 26 and the deep buried region 35 is about 130V.

To fabricate devices 10 and 11 on a semiconductor chip a p-type substrate 14 is provided and deep buried regions 100, 101 and 102 are formed in the high voltage device area on top surface thereof the substrate 14 at step 200, shown in FIGS. 3-6. Specifically, deep buried region 101 includes two different types of n-type dopants that have different rates of diffusion for a given temperature. In the current example, the first n-type dopant is antimony and the second dopant is phosphorous, both of which are implanted into a same deep buried region 101 on substrate 14 with two step implantation. High energy implanter is used for ion implantation of phosphorous, in which surface concentration of phosphorous is low enough so as to minimize, if not prevent, auto-doping problem during the growth of epitaxial layer 16, discussed more fully bellow. Deep buried regions 100 and 102 include a concentration of p-type dopants. The dopants are implanted using well known implantation and masking processes to obtain a desired dopant concentration. Specifically, deep p-type buried regions 100 and 102 are provided using high energy implanter, in which surface concentration of boron is low enough so that it does not have an auto-doping problem during growth of the first epitaxial layer in the following steps. The low voltage device area is covered to block the ion implant in this step.

Figure 3:
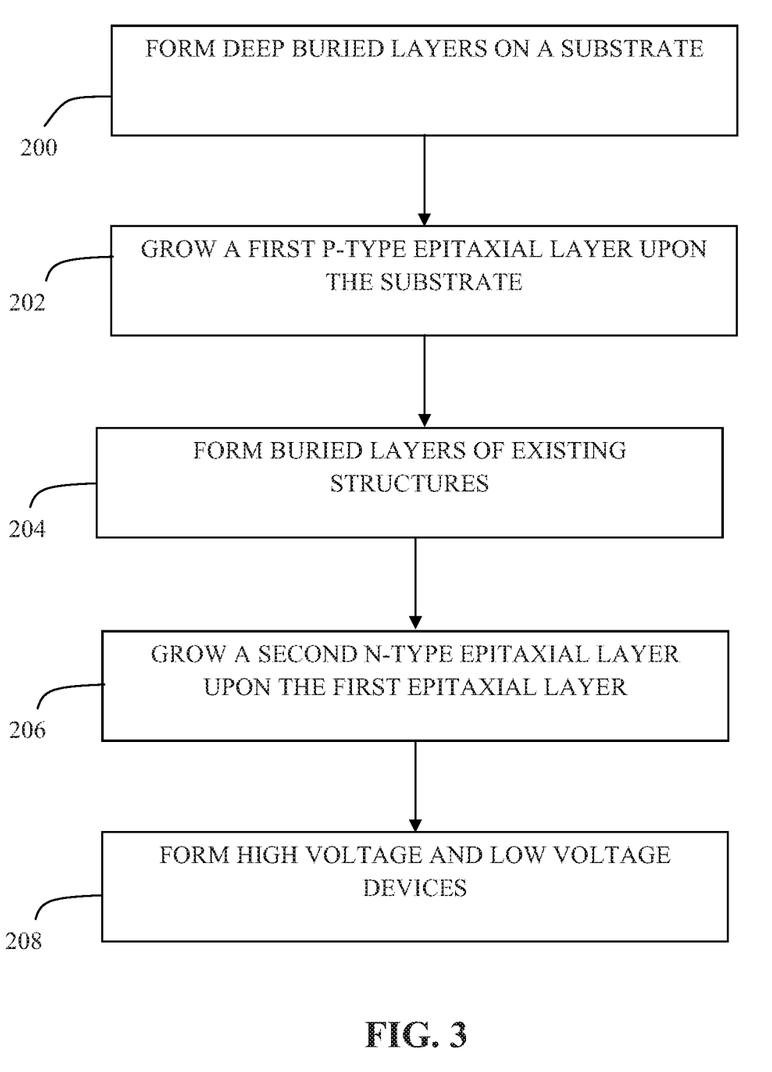
FIG. 3 is a flow diagram showing a method of fabricating the structure shown in FIG. 2.
Figure 4:
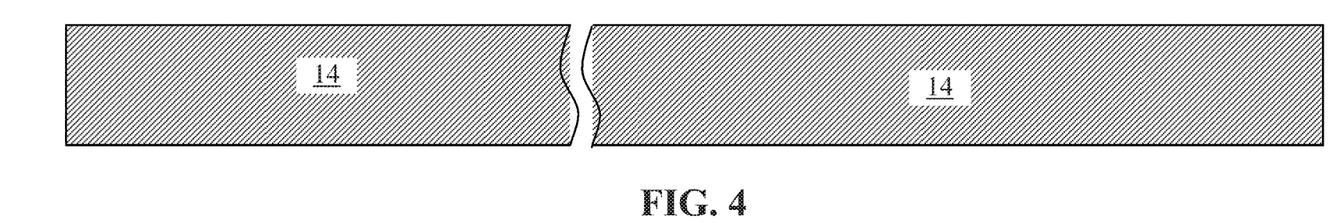
FIGS. 4-10 show cross-sectional views of the active devices shown in FIG. 2 at different steps of the fabrication process shown in FIG. 3.
Figure 5:
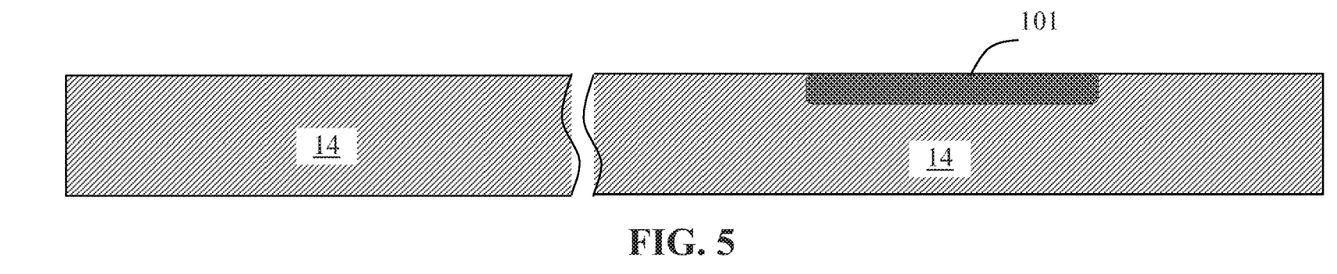
Figure 6:
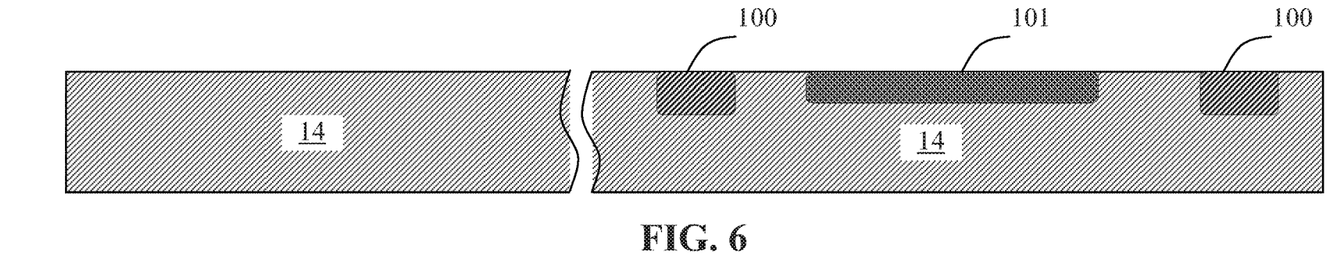
Figure 7:
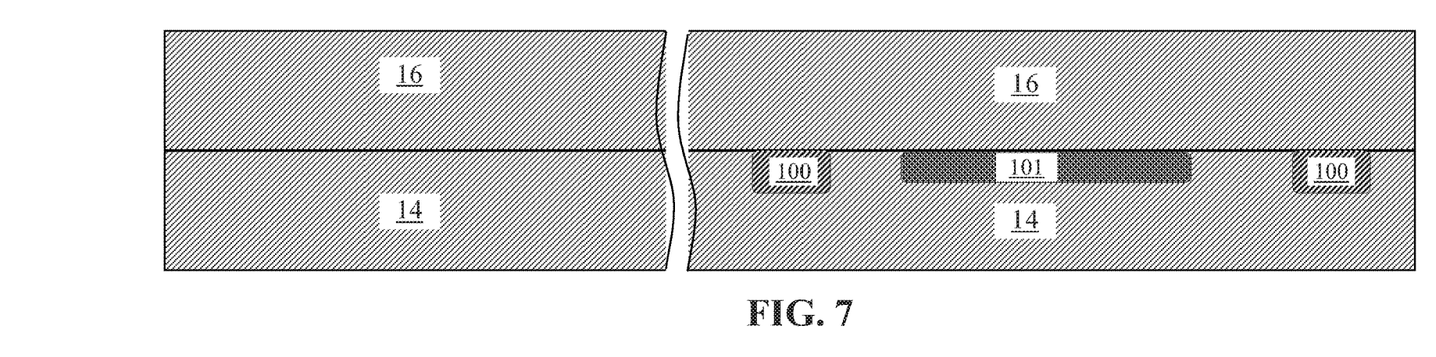
Figure 8:
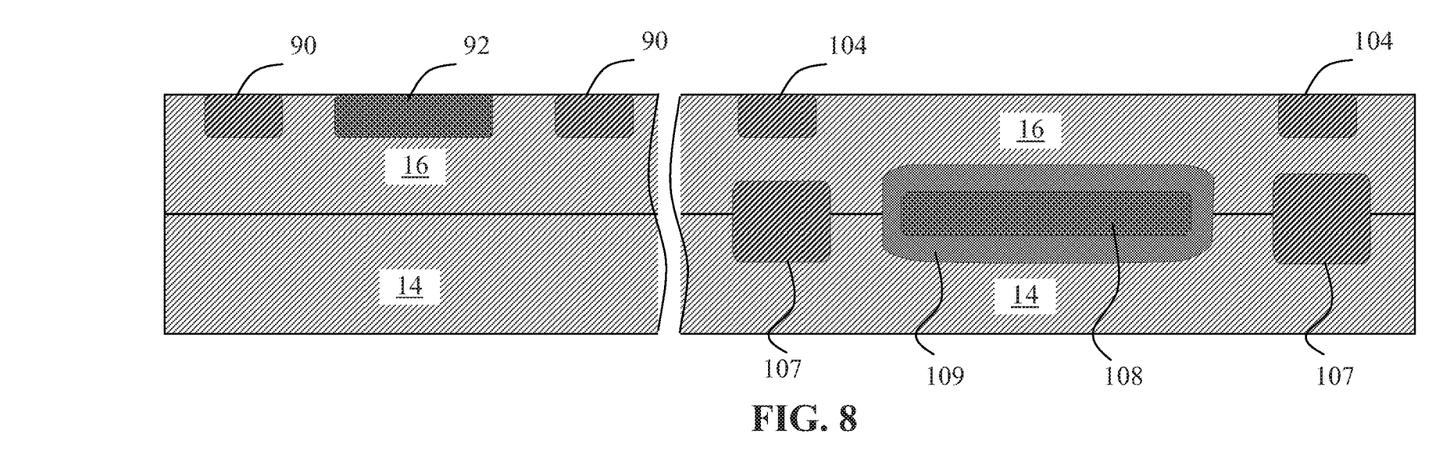

Referring to FIGS. 3 and 7, epitaxial layer 16 is grown upon the substrate 14 at step 202 all over the areas. Epitaxial layer 16 preferably has the same p-type dopant and same doping concentration as substrate 14. At step 204, buried regions 104 and 106, shown in FIG. 8, are formed on epitaxial layer 16 and on top of the deep buried regions 100 and 102 in the high voltage area. During step 204, buried regions 90, 92 and 94 are formed in the epitaxial layer 16 in furtherance of forming low voltage device 10. Buried regions 90, 94, 104 and 106 include p-type dopants, and buried region 92 includes n-type dopant. The dopant concentration in regions 90, 94, 104 and 106 are greater than the dopant concentration in the remaining, regions of layer 16. This is followed by a thermal anneal that results in the dopants in deep buried regions 100, 101 and 102, shown in FIG. 5, diffusing into both substrate and the first epitaxial layer 16, forming regions 107, 108 109 and 110, shown in FIG. 8. Specifically, the difference in the diffusion rates between antimony and phosphorous, i.e. phosphorous diffuses faster than antimony, results in region 109 surrounding region 108, as discussed above.

Figure 9:
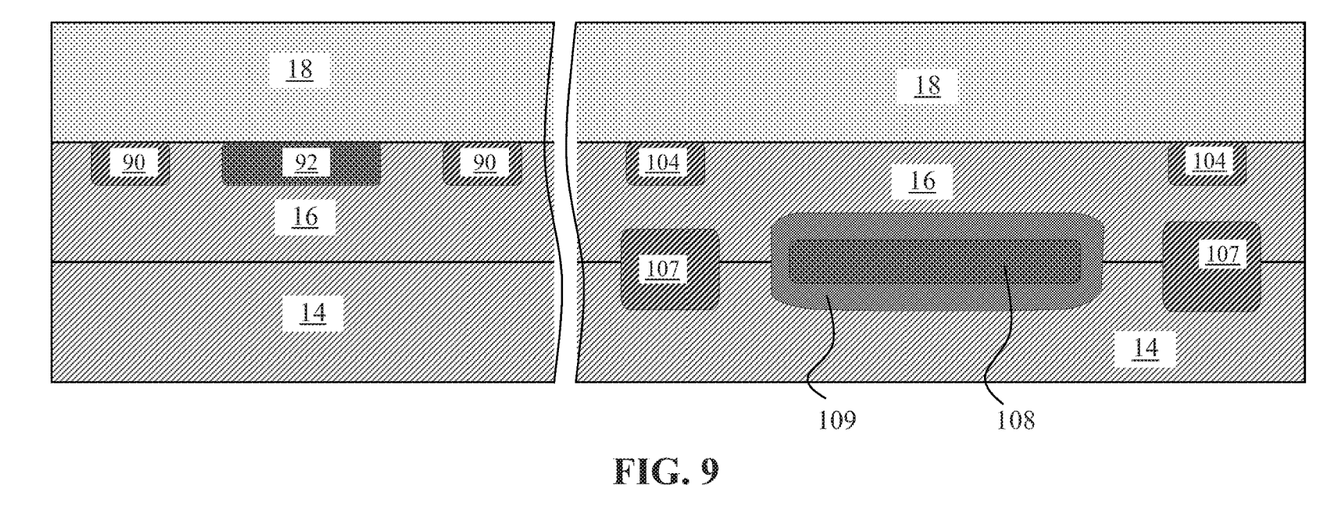

Referring to FIGS. 3 and 9 following step 204, epitaxial layer 18 is epitaxially grown upon layer 16, at step 206. Epitaxial layer 18 includes n-type dopants. At step 208 active regions of p-type dopants are implanted into sub-regions 114, 118, 122, 214, 218 and 222 of epitaxial layer 18, followed by implantation of n-type dopants into sub regions 116, 120, 216 and 220. The dopants are implanted using well known implantation and masking processes to obtain a desired dopant concentration. After implantation of dopants in sub-portions 114, 116, 118, 120, 122, 214, 216, 218, 220, and 222, sufficient thermal energy is applied to diffuse/drive dopants into layer 18 sufficiently to provide the desired dopant concentration. As a result, lightly doped phosphorous in region 109, shown in FIG. 9, expands to counter-dope p-type dopants in the added high voltage region of epitaxial layer 16 to lightly doped n-type, while the n-type well 92 expands to form region 35 in low voltage device area, shown in FIG. 10. As a result of this thermal energy, deep buried region 134, including highly doped buried region 136 and lightly doped buried region 138; isolation regions 40, 42, 140 and 142; and active regions 20 and 120 are formed. Buried region 35 is formed by diffusion of dopants in region 92. Deep buried region 134 is formed by diffusion of dopants in regions 108 and 109 as described above. Isolation regions 40 and 42 are formed by the diffusion of dopants in regions 90, 94, 114 and 122. Isolation regions 140 and 142 are formed by diffusion of dopants in regions 104, 106, 107, 110, 214 and 222, shown in FIGS. 9 and 10. Specifically, isolation region 140 is formed by merging the diffused dopants in regions 107, 104 and 214. Isolation region 142 is formed by merging the diffused dopants in regions 110, 106 and 222.

Figure 10:
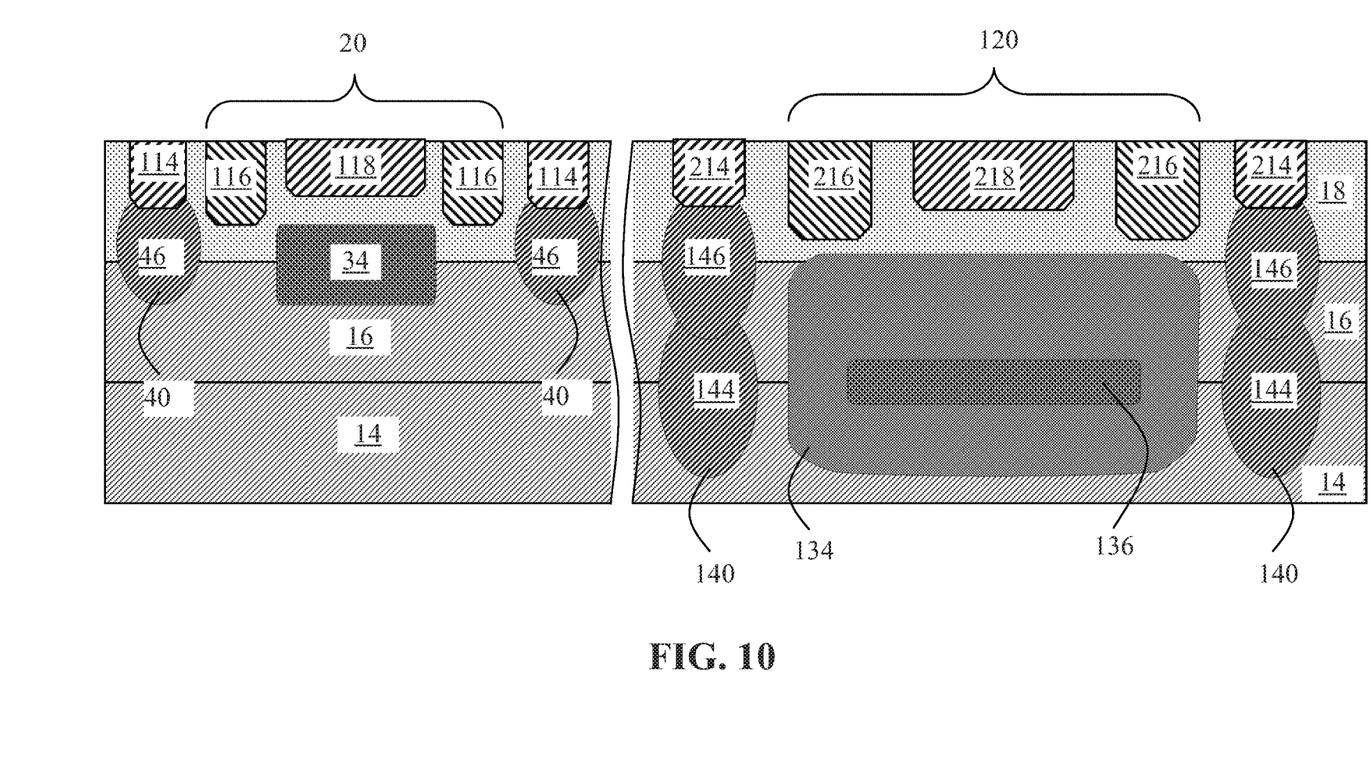

Referring to FIGS. 3 and 10, at step 208 active region of device 10 is formed by dopants being implanted into N-well regions 116 and 120 and P-well region 118 to configure the specific device structure of device 10 and active region of device 11 is formed by dopants being implanted into N-well regions 216 and 220 and P-well region 218 to configure specific device structure of device 11. It should be understood that although shown as a single step for ease of discussion, implantation of n-type and p-type dopants at step 208 occurs in multiple steps under conventional implantation and masking processes. As previously mentioned the proven process and conditions of making device 300 can be transferred in its entirety and implemented starting from step 204. The higher voltage device 11 may be manufactured during the same process when the structure of device 11 is the same as device 10. It should be understood that both existing devices and newly added devices of the present invention having higher voltage rating will co-exist on the same substrate without affecting each other.

Figure 11:
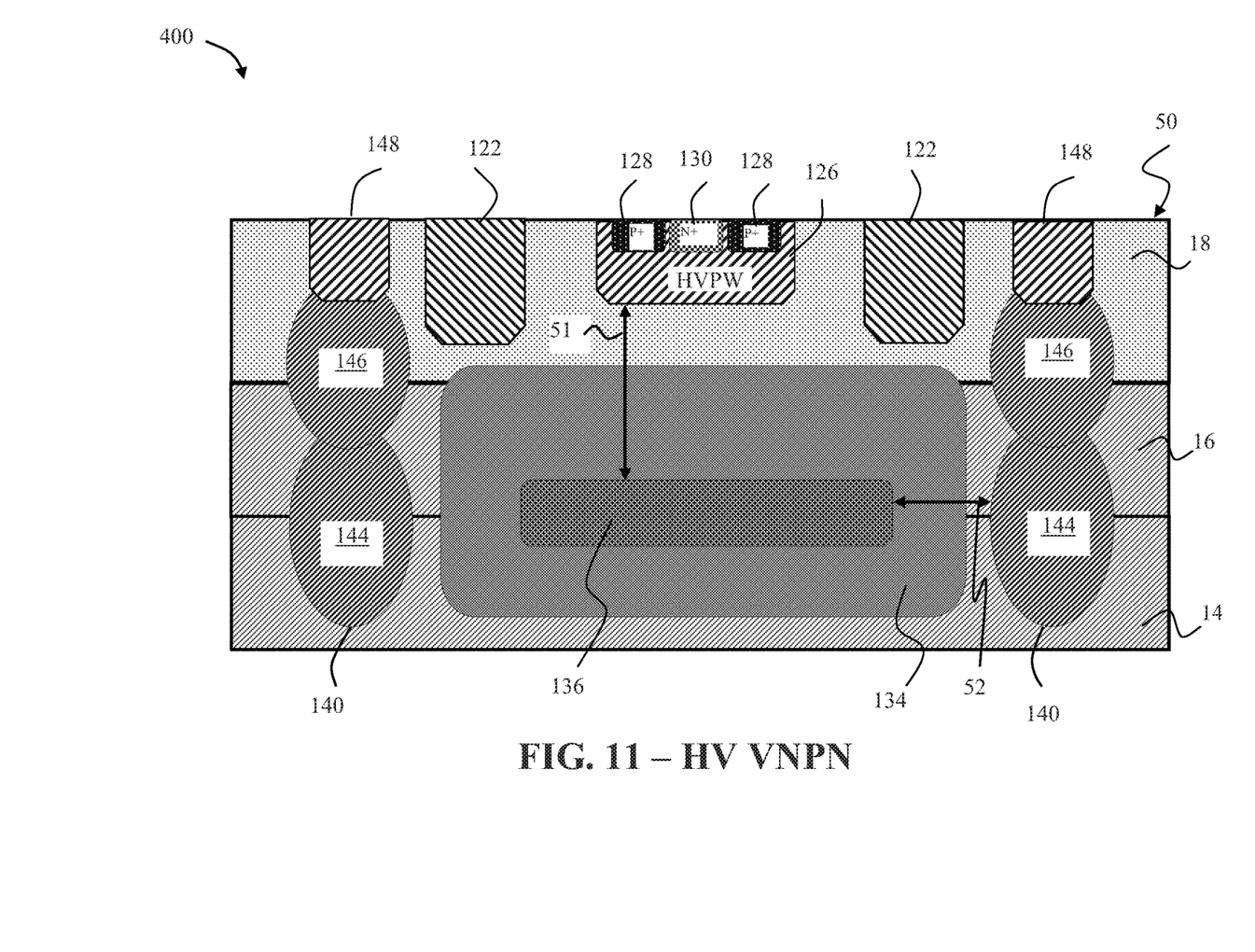
FIG. 11 is a cross-sectional view of a higher operation voltage NPN bipolar transistor according to the present invention.

The process step 208 shown in FIG. 10 provides a semiconductor chip having a higher voltage device integrated with a lower voltage device. It is understood that device 10 or 11 can be a diode, a bipolar transistor, a MOSFET or other device. It is further understood that any device combination can be integrated, together without affecting each other using the techniques disclosed by this invention. FIG. 11 shows an embodiment of device 11 provided as a high voltage vertical NPN transistor (VNPN) 400 integrated with an existing low voltage device (not shown). Device 400 is the same as device 11 except that the active area of device 400 includes a highly doped N+ region 130 disposed in the high voltage P-well 126. The highly doped N+ region 130, the P-well 126 and the N regions including a portion of the N-Epi layer 18 and deep buried N region 134 below the P-well 126 configures a vertical NPN with N+ region 130 provided as the emitter, P-Well 126 provided as the base and the N regions below the HVPW 126 provided as the collector. The P+ regions 128 disposed in HVPW 126 provide contact pickups to the base while the N regions 122 and 124 disposed in top portion of the N-Epi layer 18 outside of the HVPW 126 provide contact pickups to the collector. Depending on the doping concentration of N regions 122 and 124, highly doped N+ regions may be disposed therein to improve ohmic contact to metals electrodes not shown). The base and collector contact pickups may be formed as ring shapes in layout. The distance 51 between a bottom of the base region 126 and the deep buried highly doped region 136 controls the vertical breakdown of the NPN transistor therefore limits the operation voltage of the NPN transistor 400.

Figure 12:
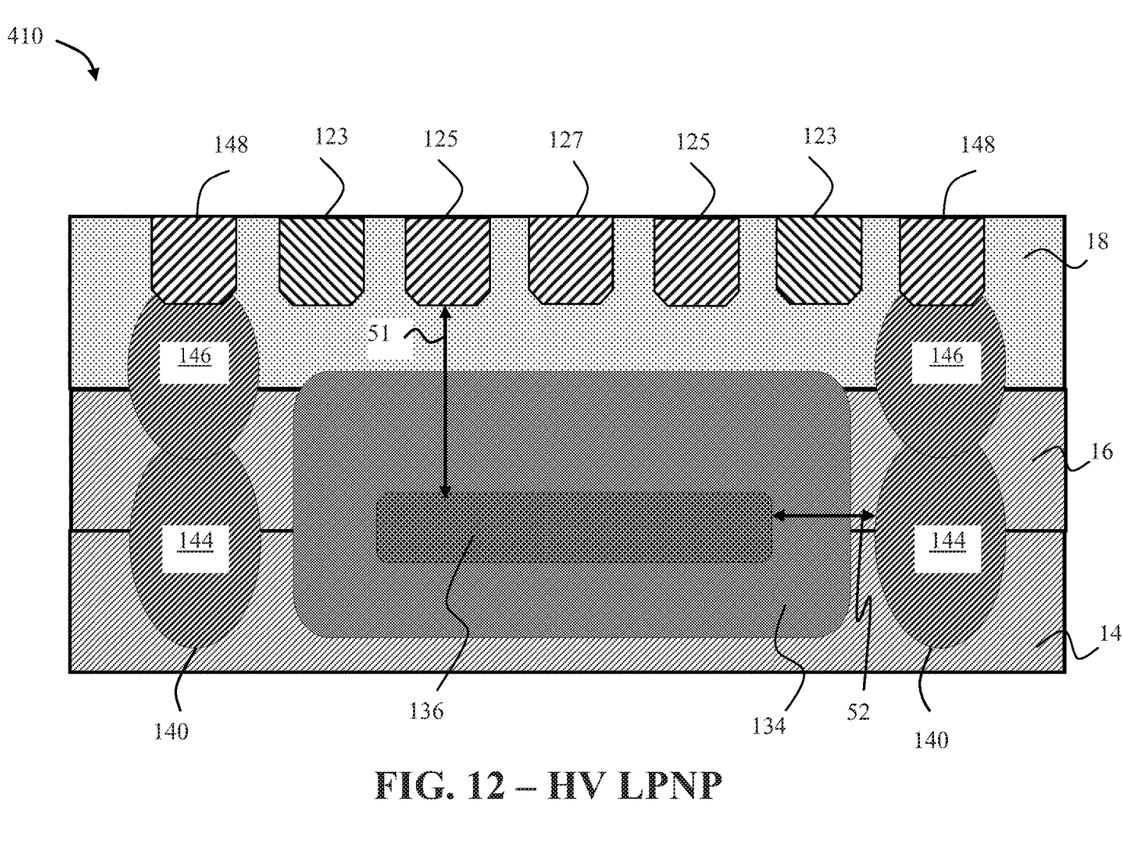
FIG. 12 is a cross-sectional view of a higher operation voltage lateral PNP bipolar transistor according to the present invention.

FIG. 12 shows an alternate embodiment of device 11 provided as a high voltage lateral PNP transistor (LPNP) 410 integrated with an existing low voltage device (not shown). Device 410 is the same as device 11 except that the active area of device 410 is configured as a lateral PNP including a P region 127 provided as the emitter, a P ring 125 provided as the collector encircling the central P emitter region 127, and a N ring 123 provided as base contact pickup encircling the collector P ring 125 and the emitter P region 127. The base region includes a portion of the N-Epi layer 18 and the deep buried N region 134, which further includes a highly doped N+ region 136 enclosed within a lightly doped N region 138. The distance 51 between a bottom of the P collector region 125 and the deep buried highly doped region 136 controls the vertical breakdown of the PNP transistor therefore limits the operation voltage of the PNP transistor 410.

Figure 13:
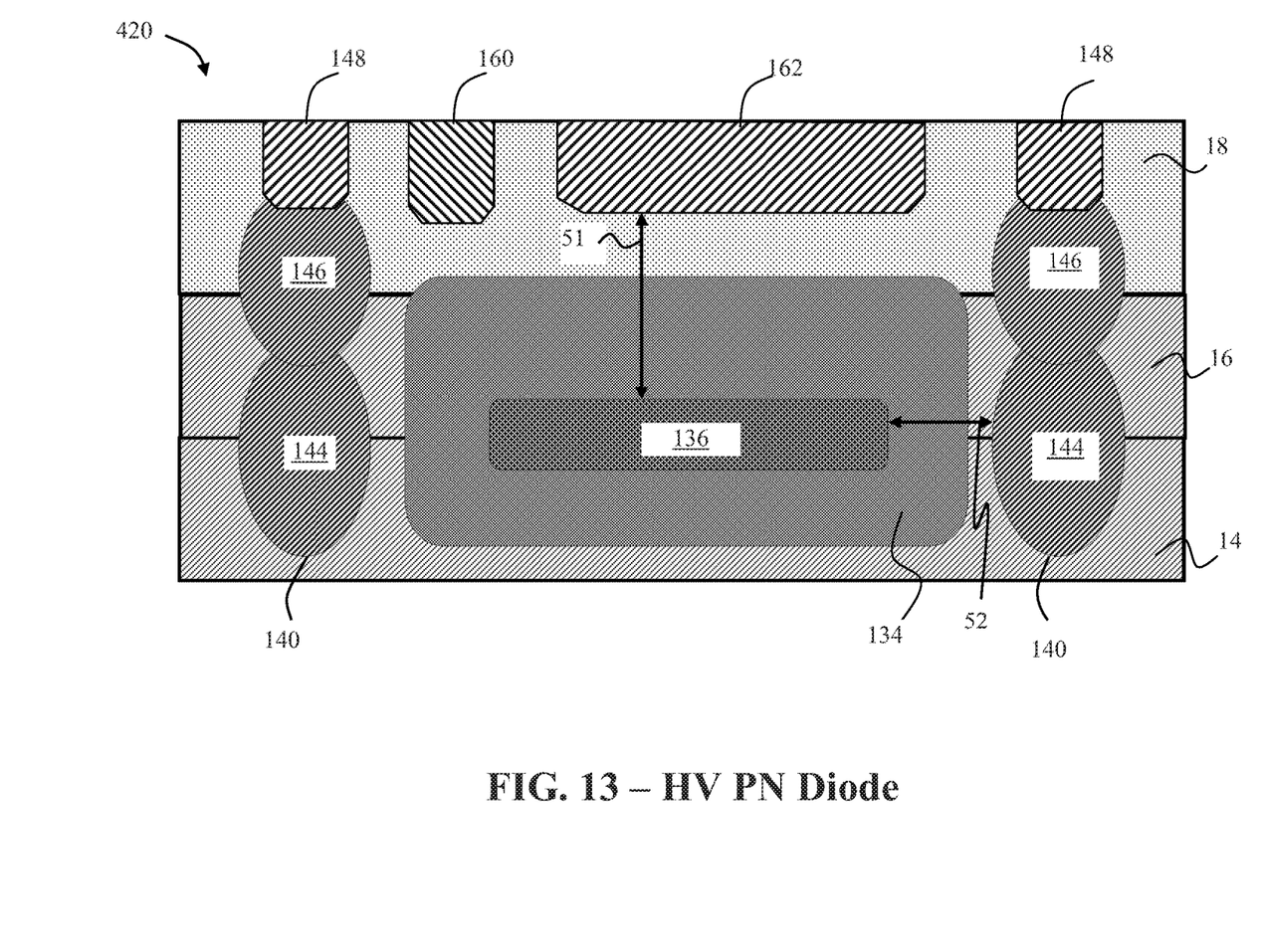
FIG. 13 is a cross-sectional view of a higher operation voltage PN diode according to the present invention.

FIG. 13 shows an alternate embodiment of device 11 provided as a high voltage PN diode 40 integrated with an existing low voltage device (not shown). Device 420 is the same as device 11 except that the active area of device 420 is configured as a PN diode including a P region 162 provided as the anode and a N region 160 as contact pickup for the cathode that includes a portion of the N-Epi layer and the deep buried region 134. The distance 51 between a bottom of the anode P region 162 and the deep buried highly doped region 136 controls the vertical breakdown of the diode therefore limits the operation voltage of the diode 420.

Figure 14:
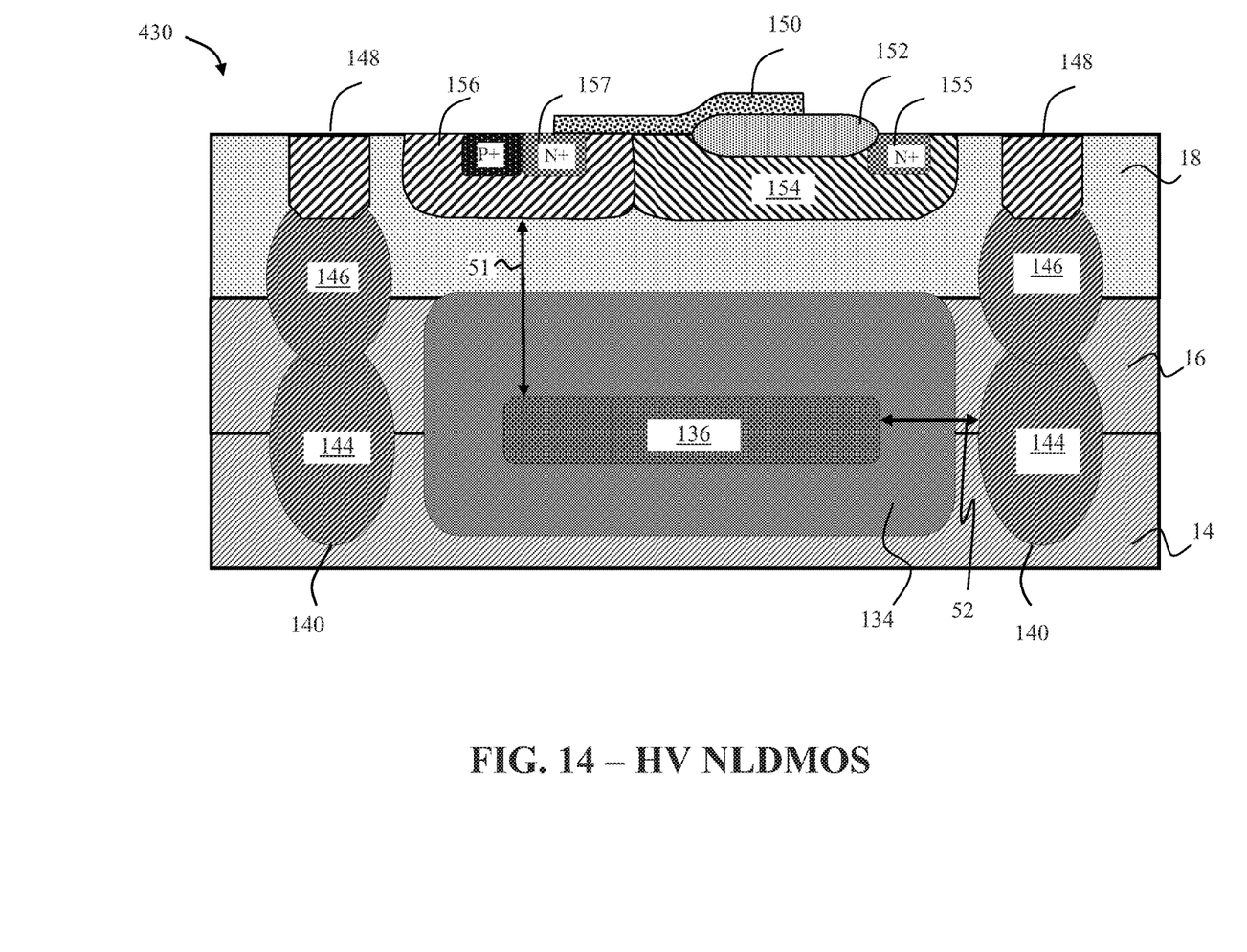
FIG. 14 is a cross-sectional view of a higher operation voltage lateral N-channel DMOS according to the present invention.

FIG. 14 shows an alternate embodiment of device 11 provided as a high voltage N-channel Lateral DMOS (LDMOS) integrated with an existing low voltage device (not shown). Device 430 is the same as device 11 except that the active area of device 430 is configured as a N-channel LDMOS that includes a N+ source region 157 disposed in P-well 156 and a drain contact pickup region 155 disposed in N-well 154. The P-well 156 is provided as the body and a N region including the N-well 154, a portion of the N-Epi layer 18 and the deep buried region 134 is provided as the drain. A field oxide 152 is formed on a top portion of the N-well 154 right next to the drain contact pickup region 155 and an insulated gate 150 disposed on top of the P-well 156 and the N-well 154 extends from overlapping a portion of the source region 157 to overlapping a portion of the field oxide 152. The distance 51 between a bottom of the P body region 162 and the deep buried highly doped region 136 controls the vertical breakdown of the N-channel LDMOS therefore limits the operation voltage of the LDMOS 430.

Figure 15:
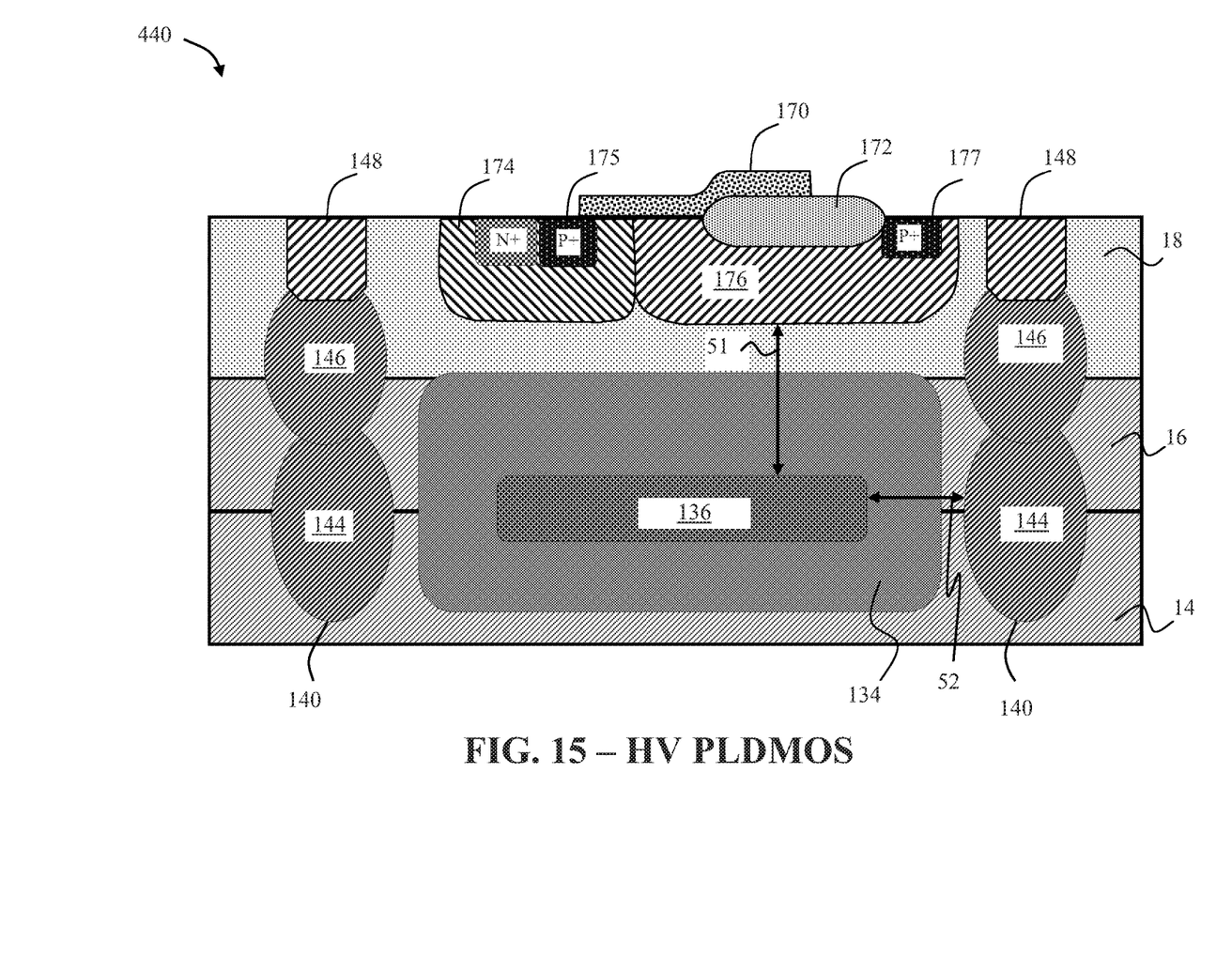
FIG. 15 is a cross-sectional view of a higher operation voltage lateral P-channel DMOS according to the present invention.

A P-channel LDMOS 440 can be formed in a same way as shown in FIG. 15, except that the P+ source region 175 is now disposed in N-well 174 provided as the body and P+ drain contact pickup 177 is now disposed in P-well 176 provided as the drain. The distance 51 between a bottom of the P drain region 162 and the deep buried highly doped region 136 controls the vertical breakdown of the P-channel LDMOS therefore limits the operation voltage of the LDMOS 440.

Figure 16:
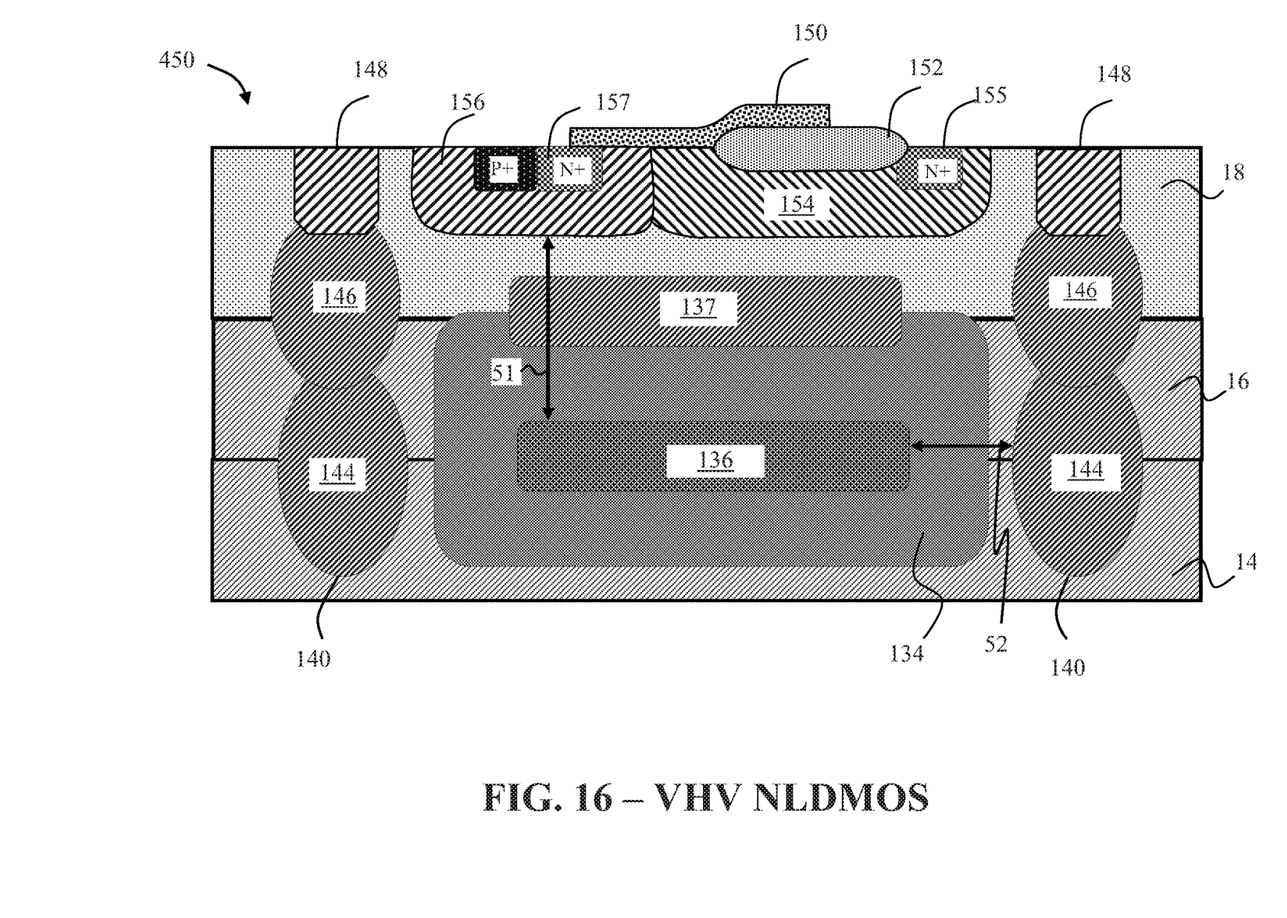
FIG. 16 is a cross-sectional view of a higher operation voltage lateral N-channel DMOS with RESURF according to the present invention.

FIG. 16 shows an alternate embodiment of device 11 provided as a very high voltage N-channel Lateral DMOS (LDMOS) integrated with an existing low voltage device (not shown). Device 450 is the same as device 430 except that a RESURF region 137 is provided as a deep P-well (DPW) on a top portion of the deep lightly doped N buried region 138. The floating DPW region 137 depletes under reverse bias therefore increases the breakdown of device to a very high voltage. The floating DPW region 137 can be formed in the process around the step of 204 by implanting a P type dopant on a top portion of the P-Epi layer 16 in the high voltage device area at the same time or after regions 104 and 106 in FIG. 8 are implanted. Preferably the floating DPW region 137 is limited to a vicinity around the interface between p-epitaxial layer 16 and n-epitaxial layer 18. The distance 51 between a bottom of the P body region 162 and the deep buried highly doped region 136 controls the vertical breakdown of the N-channel LDMOS therefore limits the operation voltage of the LDMOS 450.

This invention further discloses a method to make a device of increasing operation voltage over an existing device of same functionality by adding a few steps in the early manufacturing process of the existing device therefore without drastically affecting the device performance. Specifically after implanting the first and second ions of the second conductivity type and the ions of the first conductivity type in order to form isolation regions as described in FIGS. 5-6, a first epitaxial layer 16 of the first conductivity type is disposed on the substrate layer 14. After implanting the ions of the first conductivity type for the regions 104 and 106 in FIG. 8, the epitaxial layer 18 is then disposed on top of the substrate layer 14. By skipping most of the step 204 in FIG. 3 and only carrying out the manufacturing process in high voltage device area, higher operation voltage device compared to the FIG. 1 prior art device may be made. In this case the doping concentration of first epitaxial layer 16 may be different from that of the substrate layer 14. The device shown in FIGS. 11-16 may be provided with improved operation voltage following the rest of standard processes and conditions.

It should be understood that the foregoing description is merely an example of the invention and that modifications may be made thereto without departing from the spirit and scope of the invention and should not be construed as limiting the scope of the invention. The scope of the invention, therefore, should be determined with respect to the appended claims, including the scope of equivalents thereof.

The invention claimed is:

1. A semiconductor chip comprising a first device disposed thereon, said semiconductor chip further comprising:
   a substrate layer of a first conductivity type;
   a first epitaxial layer of the first conductivity type on top of the substrate layer;
   a second epitaxial layer of a second conductivity opposite to the first conductivity type on top of the first epitaxial layer;
   a deep buried implant region of the second conductivity type in an area for the first device;
   a first doped well of the first conductivity type extending downwards from a top surface of the second epitaxial layer above the deep buried implant region;

wherein the deep buried implant region of the second conductivity type further comprising a deep buried highly doped region of the second conductivity type and a deep buried lightly doped region of the second conductivity type surrounding the deep buried highly doped region and extending from a depth of the substrate to a top surface of the first epitaxial layer and wherein the first device comprises a N channel DMOS transistor and the first doped well is configured as a base of the DMOS transistor.

2. The semiconductor chip as recited in claim 1 wherein the deep buried lightly doped region of the second conductivity type having a doping concentration the same as the second epitaxial layer.

3. The semiconductor chip as recited in claim 1 wherein a distance between a bottom of the first doped well of the first conductivity type and the deep buried highly doped region of the second conductivity type control an operation voltage of the first device.

4. The semiconductor chip as recited in claim 1 wherein the first device comprising a PN diode and the first doped well being configured as an anode of the PN diode.

5. The semiconductor chip as recited in claim 1 wherein the N channel DMOS transistor further comprising a buried doped region of the first conductivity type disposed above the deep buried highly doped region of the second conductivity type configured as a RESURF layer.

6. The semiconductor chip as recited in claim 1 wherein the first device comprising a P channel DMOS transistor and the first doped well being configured as a drain of the DMOS transistor.

7. The semiconductor chip as recited in claim 1 further comprising isolation regions surrounding an active area of the first device.

8. The semiconductor chip as recited in claim 1 wherein the dopant concentration of the first epitaxial layer being the same as the substrate.

9. The semiconductor chip as recited in claim 8 further comprising a second device disposed in a second device area thereon, said second device area further comprising a buried implant region of the second conductivity type in a vicinity around an interface between the first epitaxial layer and the second epitaxial layer and a second doped well of the first conductivity type extending downwards from the top surface of the second epitaxial layer above the buried implant region.

10. The semiconductor chip as recited in claim 9 wherein the first device having an operation voltage higher than the second device.

* * * * *